United States Patent [19]

Mankins

[11] Patent Number: 4,900,394
[45] Date of Patent: Feb. 13, 1990

[54] PROCESS FOR PRODUCING SINGLE CRYSTALS

[75] Inventor: William L. Mankins, Huntington, W. Va.

[73] Assignee: Inco Alloys International, Inc., Huntington, W. Va.

[21] Appl. No.: 768,160

[22] Filed: Aug. 22, 1985

[51] Int. Cl.$^4$ ............................................. C30B 1/08
[52] U.S. Cl. ........................... 156/603; 156/620.73; 156/DIG. 65; 156/DIG. 73; 156/DIG. 100; 148/410; 420/441
[58] Field of Search ............... 156/603, 620, DIG. 65, 156/DIG. 73, DIG. 100; 420/441; 148/410

[56] References Cited

U.S. PATENT DOCUMENTS

| | | | |
|---|---|---|---|
| 2,739,088 | 3/1956 | Pfann | 156/620 |
| 3,027,281 | 3/1962 | Osborn et al. | 156/603 |
| 3,224,844 | 12/1965 | Gerthsen | 156/620 |
| 3,615,345 | 10/1971 | King | 156/620 |
| 3,694,269 | 9/1972 | Bailey et al. | 156/603 |
| 4,386,976 | 6/1983 | Benn et al. | 148/410 |
| 4,536,251 | 8/1985 | Chiang et al. | 156/620 |

FOREIGN PATENT DOCUMENTS

| | | | |
|---|---|---|---|
| 58-155719 | 9/1983 | Japan | 156/603 |
| 59-180003 | 10/1984 | Japan | 420/441 |

*Primary Examiner*—John Doll
*Assistant Examiner*—Robert M. Kunemund
*Attorney, Agent, or Firm*—Raymond J. Kenny; Francis J. Mulligan, Jr.

[57] ABSTRACT

A process for producing a single crystal object made of a nickel-base, O.D.S., gamma prime stengthened alloy which involves fusion welding a seed crystal to a mass of such alloy in rcrystallizable state and thereafter zone annealing to grow a single crystal through the mass of alloy.

5 Claims, 1 Drawing Sheet

4,900,394

PROCESS FOR PRODUCING SINGLE CRYSTALS

TECHNICAL FIELD

This invention relates to a process for producing single crystals of gamma prime containing oxide dispersion hardened alloys.

BACKGROUND ART

It is known to produce single crystal metallic objects by casting. This is done in a mold which permits solidification to progress from one end of the mold toward the other end of the mold. At the part of the mold at which metal first solidifies there is a crystal selector structure which, by providing a tortuous path, causes metal which is freezing to become essentially single crystal metal by bending the freezing front around corners or around bends such as in a pigtail configuration. When the freezing front of metal enters the cavity proper of such a mold the metal is or should be freezing in the configuration of a single crystal. Thereafter, the freezing front is maintained in the principal cavity of the mold to produce single crystal objects such as turbine blades useful in the hot stages of gas turbine engines. U.S. Pat. No. 3,724,531 discloses such a method.

Such a method of producing single crystal casting is of no use when the alloy out of which the single crystal object is to be made is a metal which contains a dispersion of a material which does not form a liquid phase in the molten alloy. Specifically, if the nickel base alloy is hardened by a material such as thorium oxide e.g., the alloy known as TD nickel, or is hardened by refractory oxides such as yttrium oxide or oxidic compounds thereof (ODS alloys) and perhaps also hardened by gamma prine phase, for example, as in the alloy known as MA6000, the oxidic hardening phase will not dissolve in molten alloy. If the alloy is molten to any significant extent at any stage in its manufacture, the oxidic phase will separate by gravity and not be effective for the purpose of hardening the alloy.

Alloys such as MA6000 i.e., gamma prime containing ODS strengthened nickel-base alloys and many variants and improvements thereof, are normally made by a method called mechanically alloying. In this process, powders of the alloying ingredients are subjected to vigorous mechanical working in the presence of the desired oxidic dispersant until a significant fraction of saturation hardness of the alloying ingredients is obtained as well as an intimate combination of oxidic and metallic ingredients. The powders produced by mechanical alloying are then treated using powder metallurgical techniques specifically adapted for mechanical alloyed products and at no time during the manufacture of a mechanically alloyed object or during the life time of that object is the material melted. As stated before, if significant molten phase is produced the oxidic dispersion imparting strength to the mechanically alloyed object will be destroyed.

Reference is made to the test "The Art and Science of Growing Crystals" J. J. Gilman, Editor, J. Wiley & Sons Inc., 1963 as a source of general information relative to solid state epitaxial growth of single crystals on seeds. Specific attention is directed to pages 420 and 459 wherein it disclosed that a seed crystal can be fusion welded to a striated crystalline body and thereafter annealed to promote movement of the grain boundry between the non-striated seed and the striated body.

SUMMARY OF THE INVENTION

The invention has for its objective and comprises a process for producing a single crystal object made of a dispersion strengthened, gamma prime strengthened nickel-base alloy. The process comprises providing a recrystallizable polycrystalline, dispersion strengthened gamma prime strengthened, gamma phase nickel-base alloy mass at least as large as the single crystal object to be produced and providing a single crystal seed object made of a gamma phase nickel-base alloy closely matching in gamma phase lattice parameters the gamma phase lattice parameters of the dispersion strengthened, gamma prime strengthened gamma phase nickel-base alloy in the solution treated condition. The seen object is then fusion welded to the alloy mass and the welded object is then zone annealed to epitaxially grow a single crystal from the welded joint into the alloy mass. Zone annealing is characterized by relative motion between the welded object and a localized steep gradient thermal energy source having an intensity sufficient to raise the local temperature of said welded object above the solvus temperature of the gamma prime phase in said alloy mass to thereby provide a single crystal at the expense of the existing polycrystalline structure. Thereafter, if necessary the seed single crystal is discarded and excess metal of said mass is removed to provide a single crystal dispersion strengthened, gamma prime-containing, gamma phase nickel-base alloy object.

In carrying out the fusion welding operation of the process of the invention, it is important that (a) the fusion welding not totally destroy the single crystal character of the seed and (b) allowance should be made for discard of any portion of the dispersion strengthened alloy which may be deleteriously affected by the fusion welding process. In view of these important features, it is desireable to carry out fusion welding by a process such as autogenous flash welding in which fusion time is minimized, the fusion zone is minimized and relatively little metal is upset at the fusion joint.

PREFERRED MODES FOR CARRYING OUT THE INVENTION

Gamma prime containing ODS nickel-base alloys which can be used in the present invention generally have compositions which fall within the limits of one or more of the alloying ingredient ranges as set forth in Table I.

TABLE I

| Alloy Ingredient | Broad (% by Wt.) | Preferred (% by Weight) |
| --- | --- | --- |
| Cr | 6–26 | 12–20 |
| Al + Ti | 5–10 | 6–9 |
| Mo | 0–5 | 0–3 |
| W | 0–8 | 0–5 |
| Nb | 0–6 | 0–4 |
| Ta | 0–8 | 0–6 |
| C | 0–0.3 | 0–0.2 |

TABLE I-continued

| Alloy Ingredient | Broad (% by Wt.) | Preferred (% by Weight) |
|---|---|---|
| Zr | 0–0.25 | 0–0.15 |
| B | 0–0.02 | 0–0.01 |
| Co | 0–0.25 | 0–0.15 |
| Hf | 0–3 | 0–2 |
| Re | 0–3 | 0–1 |
| Yt (as oxide) | 0.5–2.5 | 0.7–1.8 |
| Yt (as metal) | 0–1 | 0–0.5 |
| V | 0–2 | 0–1 |
| Ni | Balance Essentially | Balance Essentially |

Figure 1:
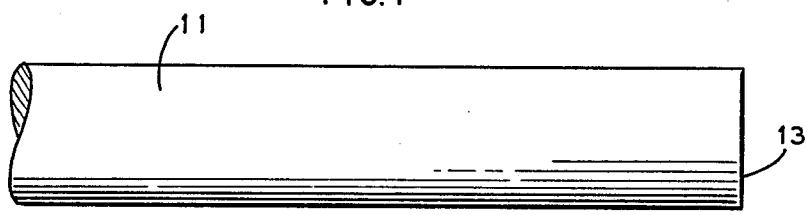
FIG. 1 of the drawing is a sketch of a bar of polycrystalline nickel-base alloy adapted to be transformed into a single crystal in accordance with the invention.

Polycrystalline, recrystallizable structures such as bar 11 in FIG. 1 of the drawing are made by mechanically working elemental and or pre-alloyed metal powders of a composition within the ranges set forth in Table I along with powders of yttria or an alumina-yttria compound until a significant fraction of saturation hardness along with an intimate admixture and dispersion of the oxide and metals are attained. The resulting worked (i.e., mechanically alloyed) powder is then compacted, for example, by hot isostatic pressing and hot worked, for example, by extrusion to produce the required metallic object. The object will be essentially of theoretical density and have a very fine recrystallizable grain structure.

Figure 2:
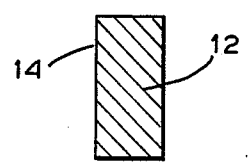
FIG. 2 of the drawing is a longitudinal sectional view of a single crystal seed usable in accordance with the present invention.

Since crystal seed 12 as depicted in FIG. 2 of the drawing can be produced in variety of ways and from a variety of materials. Seed 12 can of course be an ODS alloy, e.g., the same alloy which forms bar 11. Such a seed crystal 12 can be obtained by slicing a previously made single crystal bar. On the other hand, seed 12 can be any nickel-base alloy having lattice parameters which closely match the lattice parameters of the ODS alloy in a condition where gamma prime phase is in solution. In other words, the lattice parameters must match under the conditions of welding and zone annealing. The seed nickel-base alloy must also be characterized as being in the solid state at zone annealing temperatures. Alloy compositions for satisfactory nickel-base alloy seed materials are set forth in Table II.

TABLE II

| Alloy Ingredient | Broad (% by Wt.) | Preferred (% by Wt.) |
|---|---|---|
| Cr | 0–26 | 12–20 |
| Al & Ti | 0–10 | 6–9 |
| Mo | 0–15 | 0–3 |
| W | 0–12 | 0–6 |
| Nb | 0–6 | 0–4 |
| Ta | 0–12 | 0–6 |
| C | 0–0.3 | 0–0.2 |
| Zr | 0–0.3 | 0–0.15 |
| B | 0–5 | 0–0.01 |
| Co | 0–20 | 0–10 |
| Hf | 0–3 | 0–2 |
| Re | 0–4 | 0–2 |
| Y (as oxide) | 0–2.5 | 0.7–0.5 |
| Y (as metal) | 0–1 | 0–0.5 |
| V | 0–2 | 0–1 |
| Ni | Balance Essentially | Balance Essentially |

When the seed material is devoid of oxidic or other non-soluble dispersed phase, the seed may be made by casting such as in the method taught by Erikson et al in U.S. Pat. No. 3,724,531. Such a directionally solidified single crystal can then be conveniently sliced into a multiple of seeds.

Once bar 11 and seed 12 are provided, faying faces 13 and 14 on each are selected. Faying faces 13 and 14 are then ground, to provide reasonably close contact between the two surfaces when they abut each other. Faying faces 13 and 14 are also cleaned to remove contaminants, e.g., oxides and carbides and are thereafter kept in a protective atmosphere until they are welded together. In preparing faying surfaces 13 and 14 one can chemically modify the surfaces in order to facilitate weld bonding and subsequent epitaxial grain growth. For example, a thin nickel electrodeposit or vapor deposit can be formed on one or both of faying surfaces 13 or 14 surfaces to enhance welding.

Figure 3:
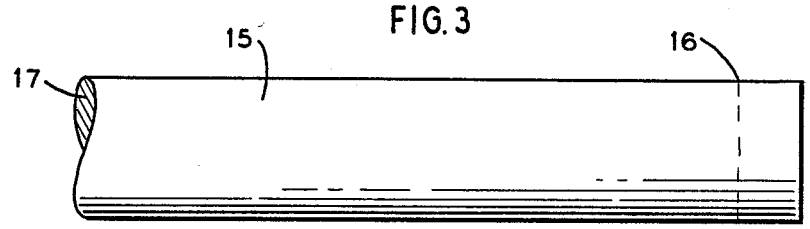
FIG. 3 is a sketch of a fusion welded single crystal/see structure useful in the process of the present invention.

Fusion welding between faying surfaces 13 and 14 to produce welded stock 15 depicted in FIG. 3 as having weld area 16 can be done by arc welding, electron beam welding, flash welding, laser welding etc. Advantageously, the welding is done by autogenous flash welding. In this process the parts to be welded i.e., bar 11 and seed 12 are abutted under moderate pressure at faying surfaces 13 and 14. Electric current from a condensor bank is then discharged across faying surfaces 13 and 14 to almost instantaneously melt peaks of the ground abutting surfaces, spray some molten particles out of the joint being made and in conjunction with applied pressure form a fused joint 16 with only minor upset of metal at fused joint 16. Preferably flash welding is carried out in an inert atmosphere such as argon in order to eliminate as much as possible oxidation of metal at joint 16 and in weld effected metal. When gamma prime solvus temperature depressants or other welding enhancers are employed in or on faying surfaces 13 and 14, a diffusion operation, subsequent to flash welding should be carried out at temperatures in the range 1010° to 1093° C. for an hour or so in order to ensure diffusion of depressants or enhancers away from the welding zone. Thus, even if adequate welding in the presence of such depressants or enhancers can be accomplished in a fraction of a second using flash welding, time should be allowed for diffusion of materials such as nickel or boron if such are used at the weld joint.

Once welded stock 15 is obtained, welded stock 15 is subjected to zone annealing in order to epitaxially grow a single crystal from weld area 16 toward bar end 17. This zone annealing, involving relative motion between welded stock 15 and a small, steep gradient thermal energy source, should be carried out at a temperature between the alloy melting point and the gamma prime solvus temperature. It may be advantageous to so design the thermal energy source so as to heat the center of welded stock 15 slightly higher than the surface. This can effectively be done by gas cooling the surface while heating welded stock 15 by direct electroinductive heating. Induction heating is preferably carried out at a relatively low frequency using equipment capable of providing a high energy density in the annealing zone. The thermal gradient between the zone being annealed and the unannealed portion of welded stock 15 should be at least about 121° in Celsius units/cm. As an alternative, zone annealing can be accomplished by indirect inductive heating using a susceptor in which case high frequency induction heating is satisfactory. As a further alternative, zone annealing can be accomplished in a tube-like furnace having a narrow heated section by causing welded stock 15 to pass therethrough.

When welded stock 15 has been zone annealed, it now comprises an epitaxially grown single crystal. Seed crystals can be sliced from the stock and single crystal objects can be machined therefrom. If seed 12 is an ODS alloy of the same composition as bar 11, it need not be removed. Even if seed 12 is not an ODS alloy but is an alloy suitable for a portion of an object, e.g., the root section of a turbine blade, it may remain as a part of the product of the process of the invention. Generally however, the seed portion to the right of weld area 16 on welded stock 15 is removed to provide the single crystal ODS alloy product. Bar 11 may be of extended length so as to provide, when sliced, single crystal material for two or more single crystal articles such as turbine blades.

Those skilled in the art will appreciate that, as depicted, seed 12 is the same diameter as bar 11. This is not necessarily the case. Smaller diameter seed can be employed provided that, after welding, and before zone annealing the material of bar 11 extending beyond the edge of seed 12 is machined or ground to a taper of at least 135° measured with respect to the axis of seed 12 from the non-faying surface end of seed 12. It is also to be understood that even though as depicted, bar 11 is cylindrical, the invention is not limited to cylindrical objects but is broadly applicable to shapes of extended length.

While in accordance with the provisions of the statute, there is illustrated and described herein specific embodiments of the invention, those skilled in the art will understand that changes may be made in the form of the invention covered by the claims and that certain features of the invention may sometimes be used to advantage without a corresponding use of the other features.

I claim:

1. A process for producing a single crystal object made of a dispersion strengthened, gamma prime strengthened nickel-base alloy comprising providing a recrystallizable polycrystalline, dispersion strengthened gamma prime strengthened, gamma phase nickel-base alloy mass at least as large as the single crystal object to be produced, providing a single crystal seed object made of a gamma phase nickel-base alloy closely matching in gamma phase lattice parameters the gamma phase lattice parameters of said dispersion strengthened, gamma prime strengthened gamma phase nickel-base alloy in the solution treated condition, fusion welding said seed object to said alloy mass along faying surfaces on said seed object and said alloy mass, zone annealing said welded object to epitaxially grow a single crystal from said welded joint into said alloy mass, said zone annealing being characterized by relative motion between said welded object and a localized steep gradient thermal energy source having an intensity sufficient to raise the local temperature of said welded object above the solvus temperature of the gamma prime phase in said alloy mass to thereby provide a single crystal at the expense of the existing polycrystalline structure and thereafter, if necessary, discarding the seed single crystal and excess metal of said mass to provide a single crystal dispersion strengthened, gamma prime-containing, gamma phase nickel-base alloy object.

2. A process as in claim 1 wherein said seed object is made of the same alloy as is said alloy mass.

3. A process as in claim 1 wherein said alloy mass is a bar.

4. A process as in claim 1 wherein a weldment enhancing material is located at or between said faying surfaces prior to fusion welding.

5. A process as in claim 4 in which said weldment enhancing material is selected from the group of boron, nickel and nickel-boron alloy.

* * * * *